US012620812B2

(12) United States Patent
Winter

(10) Patent No.: US 12,620,812 B2
(45) Date of Patent: May 5, 2026

(54) ISLAND NETWORK DETECTION BY VOLTAGE SOURCE INVERTERS, AND INVERTER

(71) Applicant: SMA Solar Technology AG, Niestetal (DE)

(72) Inventor: Björn Oliver Winter, Braunschweig (DE)

(73) Assignee: SMA Solar Technology AG, Niestetal (DE)

( * ) Notice: Subject to any disclaimer, the term of this patent is extended or adjusted under 35 U.S.C. 154(b) by 100 days.

(21) Appl. No.: 18/735,348

(22) Filed: Jun. 6, 2024

(65) Prior Publication Data

US 2024/0322572 A1 Sep. 26, 2024

Related U.S. Application Data

(63) Continuation of application No. PCT/EP2023/052637, filed on Feb. 3, 2023.

(30) Foreign Application Priority Data

Feb. 21, 2022 (DE) ..................... 10 2022 104 015.1

(51) Int. Cl.
H02J 3/38 (2006.01)
H02J 3/0012 (2026.01)
(Continued)

(52) U.S. Cl.
CPC ............ H02J 3/388 (2020.01); H02J 3/0012 (2020.01); G01R 19/2513 (2013.01)

(58) Field of Classification Search
CPC ................................ H02J 3/0012; H02J 3/388
See application file for complete search history.

(56) References Cited

U.S. PATENT DOCUMENTS 6,853,940 B2 * 2/2005 Tuladhar ................... H02J 3/38
702/108
2003/0147191 A1 * 8/2003 Deng ......................... H02J 3/38
361/62

(Continued)

FOREIGN PATENT DOCUMENTS

EP 2003759 A1 12/2008
WO 2021129944 A1 7/2021

OTHER PUBLICATIONS

D.-U. Kim and S. Kim, "Anti-Islanding Detection Method Using Phase-Shifted Feed-Forward Voltage in Grid-Connected Inverter," Oct. 8, 2019, in IEEE Access, vol. 7, pp. 147179-147190, 2019 (Year: 2019).*

(Continued)

*Primary Examiner* — Rexford N Barnie
*Assistant Examiner* — David A Shiao
(74) *Attorney, Agent, or Firm* — Eschweiler & Potashnik, LLC

(57) ABSTRACT

The disclosure is directed to an island network detection method using a voltage-impressing converter, and includes determining the frequency and phase of a voltage curve of a sub-network connected to a network connection point of the converter, and generating a voltage curve using a bridge circuit of the converter with the determined frequency. The method also includes determining a correlation between a first temporal variation and a second temporal variation of an output exchanged by the converter with the sub-network, and detecting an island network if the determined correlation undershoots a specified correlation measurement.

17 Claims, 6 Drawing Sheets

(51) Int. Cl.
　　*H02J 3/388*　　　　(2026.01)
　　*G01R 19/25*　　　　(2006.01)

(56)　　　　　References Cited

U.S. PATENT DOCUMENTS

| | | | | |
|---|---|---|---|---|
| 2004/0264089 | A1* | 12/2004 | Furuya | H02J 3/38 |
| | | | | 361/92 |
| 2006/0004531 | A1* | 1/2006 | Ye | H02J 3/381 |
| | | | | 702/60 |
| 2009/0021877 | A1* | 1/2009 | Fornage | H02J 3/381 |
| | | | | 361/78 |
| 2009/0027037 | A1 | 1/2009 | Strnad et al. | |
| 2011/0187200 | A1* | 8/2011 | Yin | H02J 3/381 |
| | | | | 307/86 |
| 2012/0306515 | A1* | 12/2012 | Barnes | H02J 3/381 |
| | | | | 324/707 |
| 2014/0078625 | A1* | 3/2014 | Zheng | H02J 3/381 |
| | | | | 702/64 |
| 2014/0254227 | A1* | 9/2014 | Hantschel | H02M 7/53875 |
| | | | | 363/131 |
| 2014/0265596 | A1* | 9/2014 | Yuan | H02J 3/381 |
| | | | | 307/69 |
| 2023/0018100 | A1* | 1/2023 | Pulikanti | G01R 19/2513 |

OTHER PUBLICATIONS

Abokhalil, A. G., Awan, A. B., & Al-Qawasmi, A.-R. (2018). May 30, 2018. Comparative Study of Passive and Active Islanding Detection Methods for PV Grid-Connected Systems. Sustainability, 10(6), 1798. (Year: 2018).*

International Search Report dated Apr. 14, 2023, for International Application No. PCT/EP2023/052637.

Gregory A. Kern. Sunsine300, Utility Interactive AC Module Anti-Islanding Test Results.: Conference record of the 26th IEEE Photovoltaic Specialists conference—1997, PVSC '97. Anaheim, CA, Sep. 29-Oct. 3, 1997; [IEEE hotovoltaic Specialists conference], New York, NY : IEEE, US Sep. 29, 1997, pp. 1265-1268.

Chuttchaval Jeraputra et al. "Development of a Robust Anti-Islanding Algorithm for Utility Interconnection of Distributed Fuel Cell Powered Generation." 2004 IEEE Applied power electronics conference and exposition, APEC 04, IEEE, Anaheim, CA. USA. vol. 3, Feb. 22, 2004, pp. 1534-1540.

\* cited by examiner

ISLAND NETWORK DETECTION BY VOLTAGE SOURCE INVERTERS, AND INVERTER

REFERENCE TO RELATED APPLICATIONS

This application is a Continuation of International Application number PCT/EP2023/052637, filed on Feb. 3, 2023, which claims the benefit of German Application number 10 2022 104 015.1, filed on Feb. 21, 2022. The contents of the above-referenced patent applications are hereby incorporated by reference in their entirety.

FIELD

The disclosure relates to a method for detecting an island network by a voltage source inverter and to an inverter of this kind.

BACKGROUND

Decentralized energy production by renewable energy sources, in particular by photovoltaics, is becoming increasingly important for the energy transition. In this respect, the component of electrical power generated in a decentralized manner in relation to power generated by power plants is constantly increasing. One concern here is that this increase in decentralized power generation raises the risk of power failures. Using voltage source or network-forming inverters instead of line-commutated inverters—the latter are also called current source inverters or current converters for short—can make a significant contribution to stabilizing the networks. Voltage source inverters are configured to provide their power by providing at their bridge output a voltage curve which is continually synchronized with a voltage curve at a network connection point of the inverter. Since a decoupling impedance is arranged between the bridge output and network connection terminal of the inverter, a defined active and reactive power exchanged with the network can be adjusted by a predefined, continually, that is to say continuously or repeatedly, updated phase and amplitude offset between the voltages at the bridge output and network connection point. For instance, EP 2 003 759 A1 discloses a method for island network detection for voltage source inverters, in which method a test voltage is superimposed on the network frequency, the test frequency of the test voltage being less than the network frequency. An island network is detected if a reactive power component assigned to the test voltage falls below a predefined minimum.

For networks having a network impedance with a prevailing inductive component, the exchanged active power is adjusted or determined by a continually updated phase difference between the voltages at the bridge output and network connection point or terminal, and the reactive power is adjusted or determined by a continually updated amplitude difference between the two voltages. For networks having a network impedance with a prevailing resistive component, the role of reactive power and active power is typically reversed. Hybrid forms are likewise conceivable. As a result, voltage source inverters are capable of independently establishing an AC voltage network and maintaining it in a stable manner.

Due to this property, however, there arises the risk that voltage source inverters also maintain the voltage in a subnetwork to which they are connected if this subnetwork is unexpectedly or forcedly disconnected from a superordinate network and for this case maintaining the voltage is undesired. In this case, the voltage source inverters readily form an island network provided that they are capable of providing the power required therefor. This can constitute a hazard if, for example, a subnetwork is disconnected from a superordinate network for maintenance purposes. It may therefore be necessary for voltage source inverters to be capable of independently detecting, within a predefined period of time, that they are connected to an island network and react to this appropriately.

Such a requirement of island network detection is customary for line-commutated inverters and is described, for example, in the technical application standard VDE_AR-N 4105 for power generating plants in the low voltage network. Corresponding methods are known. These methods cannot be readily transferred to voltage source inverters, however.

SUMMARY

The present disclosure is directed to a method with which voltage source inverters can reliably detect whether they are connected to an island network.

A method according to one embodiment of the disclosure for detecting an island network by a voltage source inverter comprises:

determining a frequency and a phase of a voltage curve of a subnetwork connected to a network connection point of the inverter, generating, by a bridge circuit of the inverter, another voltage curve having the determined frequency, wherein the phase of the generated another voltage curve comprises a temporal variation with respect to the determined phase, determining a correlation between the temporal variation and a temporal variation in a power exchanged between the inverter and the subnetwork, and detecting an island network when the determined correlation does not reach a predefined degree of correlation.

In one embodiment, the power exchanged between the inverter and the subnetwork can be the active power, for example, for networks having a network impedance with a prevailing inductive component. However, use can also be made here of the apparent power, which in certain applications is the variable that is easier to measure, or in general terms a weighted root mean square of active power and reactive power, wherein the averaging weights are determined on the basis of the resistive and inductive components of the network impedance. In one embodiment, this makes it possible to improve the detection accuracy of the method. Hereinbelow, the disclosure is in some cases described with reference to the active power as the variable used for the correlation for the sake of simplicity, with the other two possibilities not being precluded as a result.

In one embodiment, the temporal variation in the phase is an intentionally caused deviation of the phase difference between the voltage curve at the bridge output and the another voltage curve of the network connection point voltage, extrapolated from the previously determined frequency and phase of the another voltage curve at the network connection point, from a temporally constant phase difference $\Delta\varphi$. Hence, if the extrapolated another voltage curve at the network connection point is $$U_{NAP}(t) = \hat{U}_{NAP} * \sin(\omega t),$$

3 the voltage curve at the bridge output is $$U_{Br}(t) = \hat{U}_{Br} * \sin(\omega t + \Delta\varphi + \Delta\varphi_{AID}(t)).$$

The phase variation $\Delta\varphi_{AID}(t)$ can be produced as a periodic or non-periodic signal and consequently has a power component which is temporally correlated thereto and which is proportional to the phase variation; if the voltage curve at the network connection point corresponds to the extrapolated characteristic, the curve of the network voltage is thus not influenced by the power provided by the inverter. In this case, this is referred to as a fixed network since, in illustrative terms, the phase of the network is constant. The power component of the fixed network can be calculated in a known way from the phase variation using the known inductance of the network filter arranged between the bridge output and network connection point.

Provided that an island network is present, that is to say no connection to a fixed network is present, the power provided by the inverter influences the phase curve of the voltage at the network connection point in that this phase curve to some extent follows the temporal variation in phase produced by the inverter, with the result that the phase difference between the voltage characteristics at the network connection point and bridge output is less than the produced variation and is therefore less than the phase difference in the case of a fixed network. It is conceivable here, for example, if the inverter forms the only voltage source component of a subnetwork, that the phase at the network connection point follows the produced phase variation completely, with the result that a temporally constant phase difference between the network connection point and bridge output is present despite the produced phase variation. In such an embodiment, the power provided by the inverter has no power component which temporally correlates with the produced phase variation. As a result, an island network is easy to detect in this case.

However, the situation in which a certain phase constancy of the subnetwork exists can also occur in one embodiment, that is to say the phase at the network connection point only partially follows the phase variation. The phase difference then only mirrors the produced phase variation to a lesser extent, and a power component which temporally correlates with the produced phase variation is less than the power component which is caused in the case of the fixed network described above. An island network can be detected by a suitably selected degree of correlation, for example, by a ratio between a power component determined from the correlation with the phase variation and the power component of the fixed network. The smaller this ratio, the more likely it is that an island network is present.

One example embodiment for determining a degree of correlation K is given by the relationship $$K = \frac{\int \Delta\varphi_{AID}(t) * P(t)dt}{\int \Delta\varphi_{AID}{}^2(t)dt}$$

and is suitable, for example, for periodic phase variations. In this method, it is assumed that $\int \Delta\varphi_{AID}(t)\, dt = 0$. In practice, the degree of correlation is often ascertained by a corresponding summation using a time series of measured power values and of the associated phase variation produced. Other methods of forming the correlation are of course also conceivable and contemplated as falling within the scope of the present disclosure, for example, the frequency component of the power variation at the frequency of the phase variation can be determined using a lock-in amplifier and put in a ratio with the amplitude of the phase variation in order to determine a suitable degree of correlation.

In one embodiment, the selection of a limit value for the degree of correlation, which limit value, if it is not reached, indicates that an island network is detected, can be adapted to match the installation situation of the inverter. If it is known, for example, that further voltage source inverters are installed in a network section, the subnetwork itself will have a certain phase constancy, caused by the further voltage source inverters, in response to the phase variation produced by the method according to the disclosure upon being disconnected from a superordinate network. During normal operation, these inverters are synchronized with the phase at their network connection point either continually or at certain time intervals, also referred to as synchronization frequency below. It is therefore preferred, in one embodiment, to produce the phase variation having a variation frequency which is lower than the synchronization frequency or lower than the typical value range of the synchronization frequency of the further inverters, and which in one embodiment is a fraction, for example, a half, a third or a quarter of the synchronization frequency, since the phase constancy is reduced with regard to such a slow phase variation on account of the synchronization taking place during normal operation.

It is likewise advantageous in one embodiment to generate the phase variation as a periodic variation having a first frequency and a second frequency, the second frequency being greater than the first frequency, of which the first variation frequency is, in one embodiment, less than the synchronization frequency and the second variation frequency is, in one embodiment, greater than the synchronization frequency. By comparing, for example, a ratio of the power component at the first variation frequency relative to the power component at the second variation frequency, it can be discerned whether a phase constancy is caused by a superordinate network or other voltage source inverters. If the phase constancy is caused by other voltage source inverters, the power component will turn out to be lower at the second variation frequency than at the first, smaller variation frequency, the mentioned ratio of the power components thus being greater than in the case of a superordinate network still being present. In one embodiment, this response can be used, in addition or alternatively, in the detection of an island network.

In one embodiment of the disclosure, the method is repeated at time intervals. For example, as soon as an island network is detected, the inverter disconnects itself from the subnetwork. It is conceivable here that, after detecting an island network but before being disconnected from the subnetwork, the inverter is operated in such a way that it drives an amplitude and/or a frequency of the AC network to be outside of permissible network parameters in order to cause disconnection of further network components connected to the subnetwork. This increases the certainty that a detected island network is reliably de-energized.

In one embodiment, in addition to or instead of being disconnected from the subnetwork, the inverter can provide a detection signal if an island network is detected. For this purpose, a dedicated signal output can be provided, or the inverter uses a digital communication interface to provide the detection signal. The detection signal can also be provided and transmitted as a signal modulated onto the generated AC voltage in the form of a power line communication (PLC) signal.

The detection signal provided in this way can be transmitted to a network operator and/or used in order to cause a further device connected to the subnetwork, for example, a synchronous generator, to shift the amplitude and/or frequency of the AC network to values outside of permissible network parameters in order to disconnect further network components connected to the network.

In one embodiment of the disclosure, the temporal variation in the phase has a periodic variation having a first component at a first variation frequency. In one embodiment, an island network is detected when a ratio between a component of the active power at the first variation frequency and the first component of the periodic variation as the degree of correlation falls below a predefined limit value (first detection criterion).

In a further embodiment of the disclosure, the temporal phase variation has, in addition to the first component at the first variation frequency, a second component having a second variation frequency which is higher than the first variation frequency. An island network is detected here, for example, if a ratio between a component of the active power at the first variation frequency and a component of the active power at the second variation frequency falls below a predefined limit value. This second detection criterion can be used as an independent detection criterion or in a logical combination with the first detection criterion.

In order to minimize a negative effect on the network quality by the detection method, producing the voltage curve can involve gradually increasing the amplitude of the phase variation, wherein the method is terminated without detecting an island network when the variation in the active power exchanged between the inverter and the AC network exceeds a predefined termination value. In one embodiment, the termination value can be predefined as a fixed value or be determined as a function of a voltage component, determined before carrying out the method, at the network connection point at the used variation frequency. The latter makes it possible to take into account a potential interaction with other voltage source inverters which likewise carry out the method according to the disclosure for detecting an island network at the same variation frequency or a variation frequency which deviates only slightly, such that the detection methods have less of an influence on each other and therefore become more reliable. It is also conceivable to use the value of the amplitude of the phase variation upon termination of the method in order to define a starting amplitude of the phase variation for subsequent island network detection methods. As a result, a negative effect of the method according to the disclosure on the network quality can be reduced.

In order to further take into account such interaction, determining the frequency and phase of a voltage curve of the AC network connected to the network connection point of the inverter can comprise determining a third temporal variation in the phase, wherein, within the scope of the island network detection, the voltage curve is generated having a temporal phase variation which is synchronous with the previously determined third temporal variation in the phase. In this way, a plurality of voltage source inverters can interact in a constructive manner in the island network detection and increase the detection sensitivity.

The method according to the disclosure can be performed both by an inverter connected to a single phase and by an inverter connected to multiple phases with a first phase conductor and a second phase conductor. In the latter case, the method can be performed on the first phase conductor and the second phase conductor concurrently or one after the other, wherein an island network is detected if a phase island network is detected on at least one of the phase conductors. Alternatively, an island network can be detected when a phase island network is detected on both the first phase conductor and the second phase conductor.

In accordance with these embodiments, the method can also be extended to further phase conductors via which the inverter is connected to the network.

In a further embodiment of the disclosure, a voltage source inverter comprises:

a measuring circuit configured to determine a frequency and phase of a voltage curve of a subnetwork connected to a network connection point or terminal of the inverter, and further configured to determine values of active power and reactive power exchanged with the subnetwork, a control circuit configured to generate switching commands for a bridge circuit of the inverter such that a voltage curve predefined by the control circuit and having the determined frequency is generated at an output point of the bridge circuit, wherein the control circuit is configured to provide the predefined voltage curve having a temporal variation in the phase with respect to the phase of the determined voltage characteristic, and a correlator device configured to determine a correlation between the temporal variation in the phase and a temporal variation in an active power exchanged between the inverter and the subnetwork, wherein the correlator device is configured to detect an island network when a degree of correlation of the determined correlation does not reach a predefined limit value.

BRIEF DESCRIPTION OF THE DRAWINGS

The disclosure is illustrated below using figures in which.

DETAILED DESCRIPTION

Figure 1:
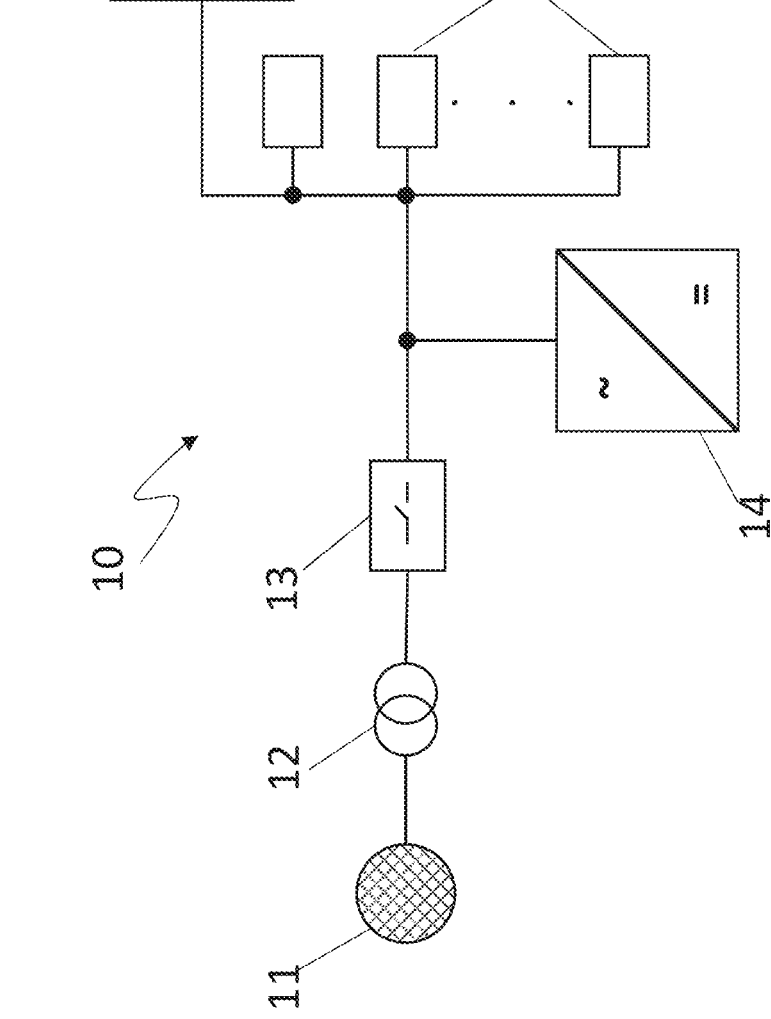
FIG. 1 shows an installation example for a subnetwork having a plurality of inverters.

FIG. 1 shows an example design of a subnetwork 10 connected to a superordinate network 11 via a circuit breaker 13 and medium-voltage transformer 12. The subnetwork 10 comprises a voltage source inverter 14, a further inverter 15 and a number of loads 16 which are at least in part supplied with power by the inverters 14, 15 and possibly from the network 11. The further inverter 15 can likewise be designed to be voltage source or alternatively line-commutated. The subnetwork 10 can have further components which feed-in power. The voltage source inverter 14 can be connected to a battery and/or to generators, for example, to photovoltaic generators, on the DC side. It is also conceivable to connect a load, rather than an infeed apparatus, via the voltage source inverter. The inverters 14, 15 can each be designed as purely feed-in inverters or else as bidirectional inverters.

Figure 2:
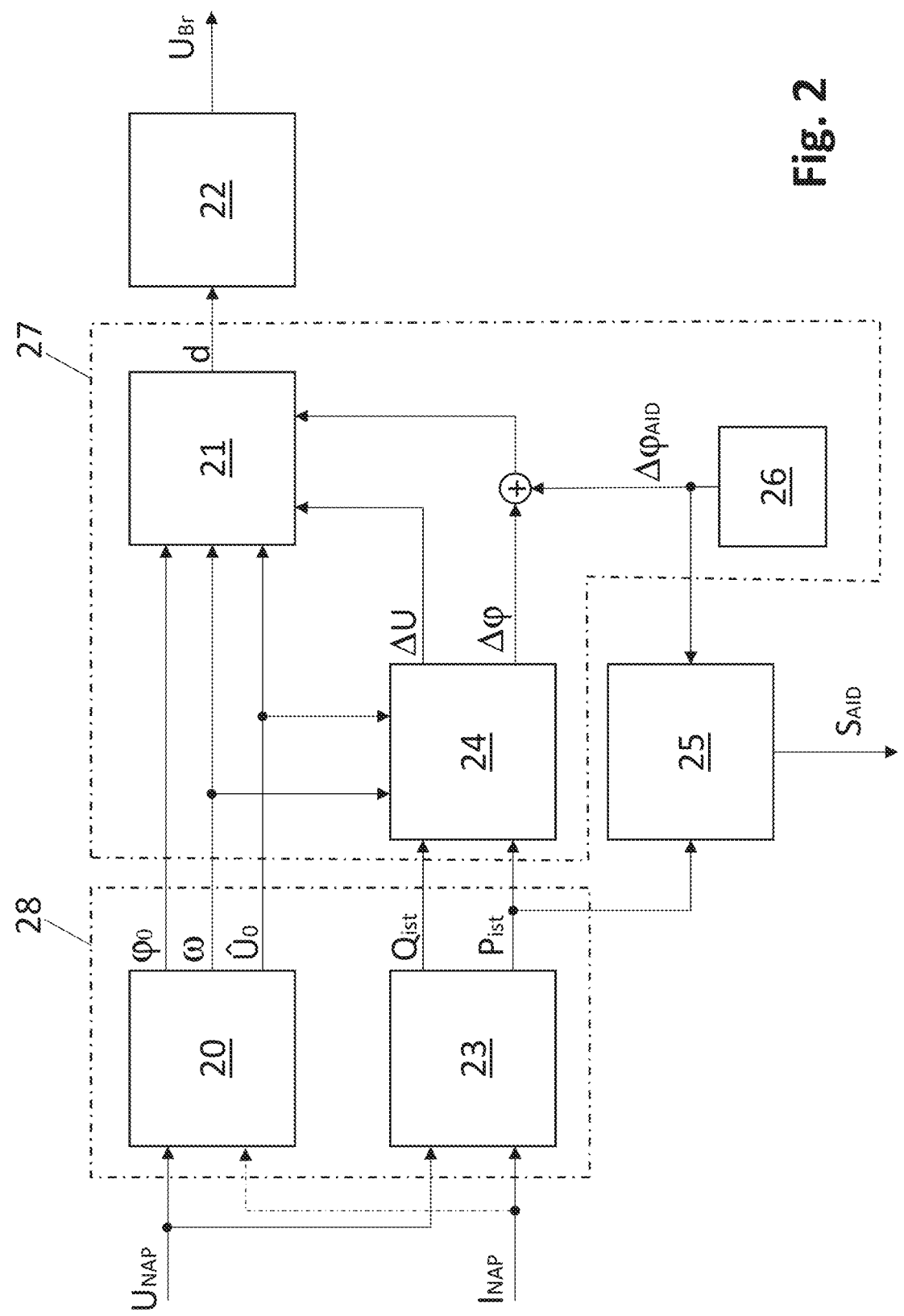
FIG. 2 shows a controller structure for an inverter according to the disclosure.

A controller structure of a voltage source inverter according to the disclosure is shown in FIG. 2. Measured values of a voltage $U_{NAP}$ at the network connection point or terminal of the inverter, possibly supplemented by measured values of a current $I_{NAP}$ flowing through the network connection point or terminal, are evaluated in a phase evaluation circuit or unit 20 in order to determine an amplitude $\hat{U}_0$, a frequency $\omega$ and a phase $\varphi_0$ of the voltage $U_{NAP}$ at the network connection point. The phase evaluation circuit or unit can be configured as a phase lock loop (PLL), for example. The determined values are supplied to a pulse-width-modulation (PWM) generator 21 as input variables for generating a pulse pattern having a duty cycle d, which pulse pattern is used to operate a bridge circuit 22 in order to provide a voltage $U_{Br}$ at its bridge output. The bridge circuit 22 here can be a single-phase or a polyphase bridge circuit, wherein a dedicated pulse pattern can be generated for each of the phase conductors. Different topologies of the bridge circuit 22 having a varying number of bridge switches, for example, multi-level topologies, are conceivable here, wherein the pulse pattern can have individual switching commands for the respective bridge switches.

The measured values of the voltage $U_{NAP}$ at the network connection point and measured values of the current $I_{NAP}$ at the network connection point are also supplied to a power determining circuit or device 23 which assigns present values of the active power $P_{ist}$ and reactive power $Q_{ist}$ flowing through the network connection point, to the mentioned measured values. The phase evaluation circuit or unit 20 and the power determining circuit or device 23 are combined together to form a measuring circuit or unit 28.

The values of active power $P_{ist}$ and reactive power $Q_{ist}$ flowing through the network connection point are supplied as input variables to a characteristic curve circuit or unit 24 which, on the basis of the additional input variables of the amplitude $\hat{U}_0$ and frequency $\omega$ determined by the phase evaluation circuit or unit 20, determines characteristic variables which represent setpoint values of reactive power and active power. During the determination of the setpoint values, further variables can of course also be taken into account, for example, the link circuit voltage or the state of charge of a battery connected on the DC side. In the case shown in FIG. 2, these characteristic variables are produced as amplitude difference $\Delta U$ and phase difference $\Delta\varphi$ which are supplied as further input variables to the PWM generator 21 in order to generate a pulse pattern by way of which the voltage curve $U_{Br}$ generated by the bridge circuit 22 has a corresponding amplitude difference or phase difference to the curve of the voltage $U_{NAP}$ at the network connection point. In this case, amplitude difference $\Delta U$ and phase difference $\Delta\varphi$ are determined as a function of an inductance of a decoupling inductor of the voltage source inverter, which decoupling inductor is arranged between the bridge output and the network connection point. In order to determine setpoint values of active power and/or reactive power, stored in the characteristic curve circuit or unit 24 are characteristic curves which determine, for example, a setpoint of the active power from the frequency $\omega$ and a setpoint of the reactive power from the amplitude $\hat{U}_0$. The characteristic curves can however also contain further parameters, which may be implemented as fixedly predefined parameters but also as variable parameters, for example the above-described link circuit voltage or the state of charge of the battery.

During those periods of time in which island network detection is being performed by the voltage source inverter, an additional phase difference $\Delta\varphi_{AID}$ is added to the phase difference $\Delta\varphi$ determined by the characteristic curve circuit or unit 24, the additional phase difference being generated by a generator 26 as a quantity which is temporally variable. In this embodiment, the temporally variable quantity can be a periodic signal which has one or more frequency components. However, it is also conceivable to use a non-periodic signal, for example, a step function. The non-periodic signal can, for example, be parameterized on the basis of communicated information, for example, with regard to shape or time or in another way.

During those periods of time in which no island network detection is being carried out, the additional phase difference $\Delta\varphi_{AID}$ is zero or is not added to the phase difference $\Delta\varphi$.

A correlator circuit or device 25 determines a temporal correlation between quantities, supplied as input variables, of the curve of the active power $P_{ist}$ and the additional phase difference $\Delta\varphi_{AID}$ generated by the generator, and calculates therefrom a degree of correlation between these quantities which is compared with a predefined limit value in order to generate a signal $S_{AID}$ which is provided by the voltage source inverter as an internal or external signal and which indicates whether the inverter detects a present island network. If the calculated degree of correlation does not reach the predefined limit value, a detected island network is therefore indicated. The inverter itself, but also other devices which receive the provided signal $S_{AID}$, can react to this signal accordingly.

In this case, the PWM generator 21, the generator 26 and the characteristic curve circuit or unit 24 are part of a control circuit or unit 27 of the voltage source inverter.

Figure 3:
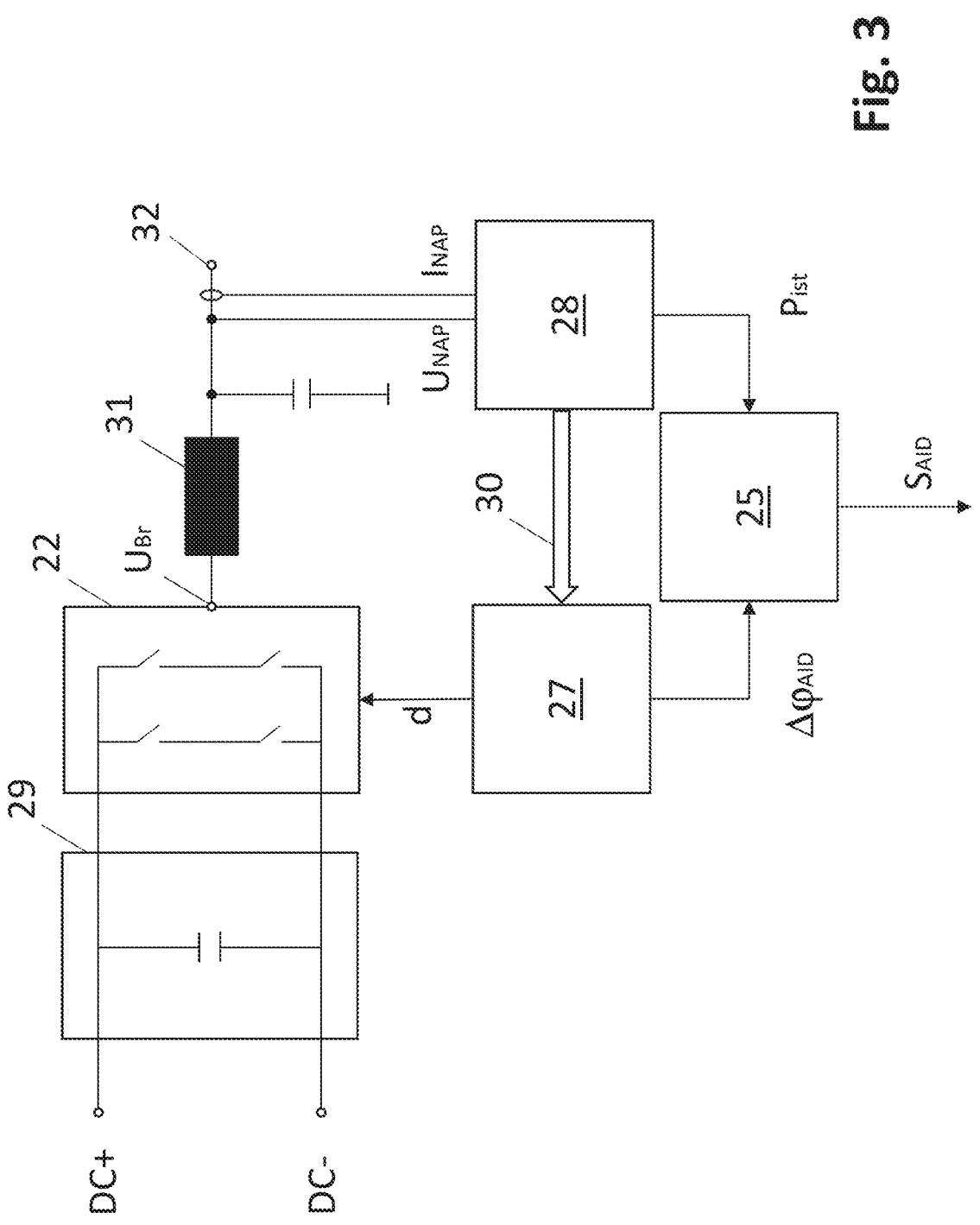
FIG. 3 shows a schematic illustration of an inverter according to the disclosure.

FIG. 3 shows a schematic design of an inverter according to the disclosure. DC-side connections DC+, DC− are connected to a bridge circuit 22 via a link circuit 29, a desired bridge output voltage $U_{Br}$ being generated at the bridge output of the bridge circuit by suitably controlling the bridge switches using a duty cycle d. The bridge output is connected to a network connection terminal or point 32 of the inverter via a decoupling inductor 31 which is part of a network filter. Further components which can be arranged in the connection between the bridge output and the network connection terminal or point, for example, an isolating relay, are not depicted for the sake of clarity. Suitable measuring sensors are used to continually or periodically measure current and voltage at the network connection terminal or point 32 and the measured values are supplied to the measuring circuit or unit 28 and evaluated there to form network parameters 30 such as frequency, phase, amplitude, reactive power and active power. These network parameters 30 are transmitted to the control circuit or unit 27 which determines therefrom the duty cycle d for controlling the bridge switches required for generating the desired bridge output voltage $U_{Br}$.

The control circuit or unit 27 here transmits the periodic or non-periodic phase difference $\Delta\varphi_{AID}$ produced for carrying out the island network detection method according to the disclosure to a correlator 25 which ascertains a temporal correlation of the phase difference $\Delta\varphi_{AID}$ with a power variable ascertained by the measuring circuit or unit 28, here an active power $P_{ist}$, and calculates a corresponding degree of correlation between the two variables. A detection signal $S_{AID}$ for an island network is generated on the basis of the degree of correlation calculated in this way, by comparing the latter with a predefined limit value, for example, and is provided for transmission within the inverter or at an output or a communication interface.

Figure 4:
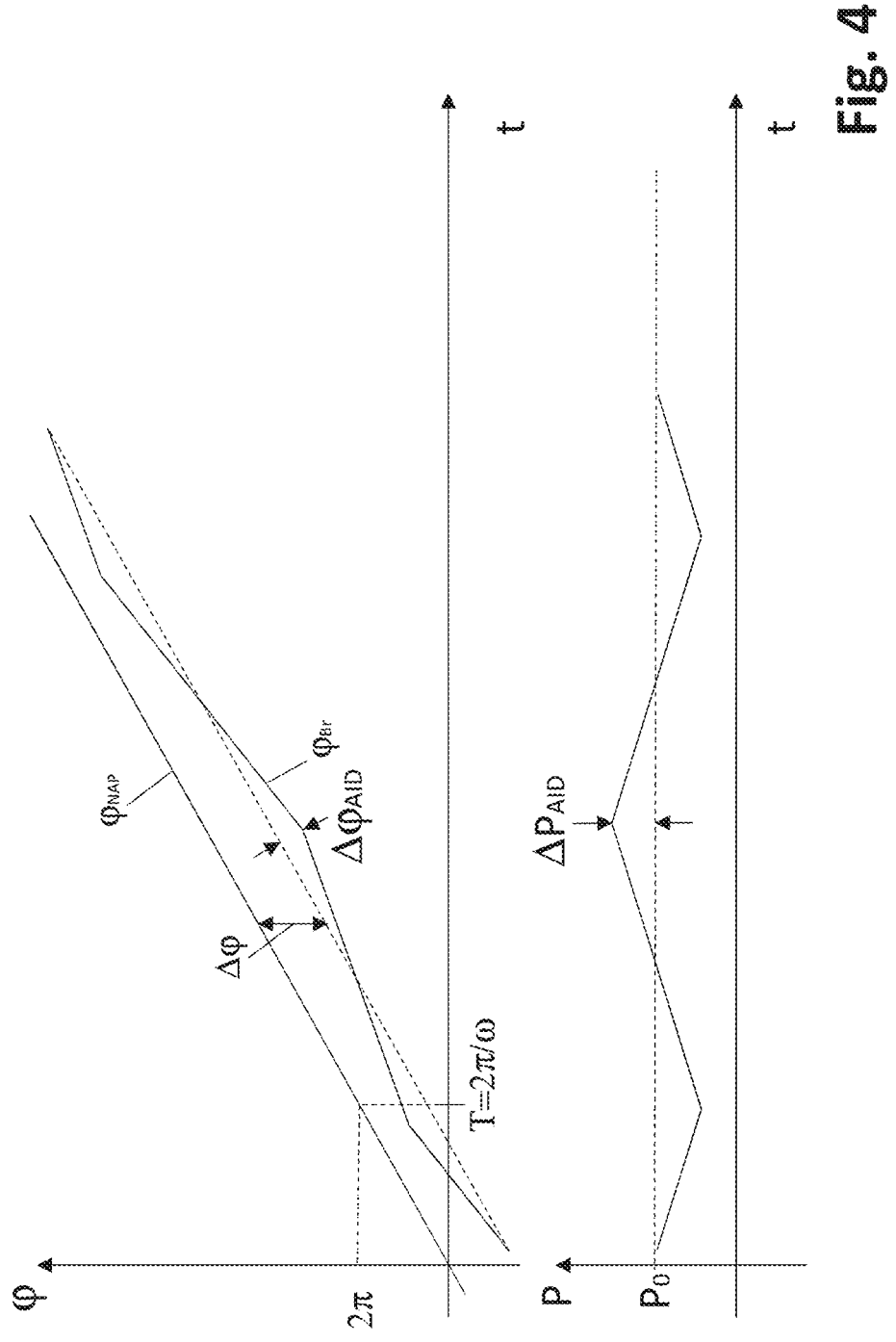
FIG. 4 shows time characteristics of phase and exchanged power when performing the method according to the disclosure in the case of a connection to a superordinate network.

FIG. 4 shows time characteristics of variables relevant for understanding the disclosure, when performing the method according to the disclosure in the case of a connection of the voltage source inverter performing the method to a superordinate network. The upper partial graph here shows the time curve of the phase $\varphi_{NAP}$ at the network connection terminal or point and the time curve of the corresponding phase $\varphi_{Br}$ at the bridge output terminal. In the example shown in FIG. 4, the phase $\varphi_{NAP}$ at the network connection terminal or point is strictly linear having a gradient which is a function of the frequency $\omega$ of the network. For this purpose, the phase $\varphi_{Br}$ at the bridge output is firstly offset with respect to the phase $\varphi_{NAP}$ at the network connection point by a temporally constant phase difference $\Delta\varphi$ but periodically deviates from this offset characteristic, here in the form of a triangular waveform having an amplitude $\Delta\varphi_{AID}$. By virtue of the fact that the periodic deviation of the phase $\varphi_{Br}$ at the bridge output is not transferred to the curve of the phase $\varphi_{NAP}$ at the network connection terminal or point, the curve of the phase $\varphi_{NAP}$ at the network connection point, in illustrative terms, is thus constant, the difference between the phase $\varphi_{Br}$ at the bridge output and the phase $\varphi_{NAP}$ at the network connection point also having a periodic curve having an amplitude $\Delta\varphi_{AID}$.

The lower partial graph shows a time curve of an active power P at the network connection point, corresponding to the phase curve of the upper partial graph. The active power has a periodic curve corresponding to the difference between the phase $\varphi_{Br}$ at the bridge output and the phase $\varphi_{NAP}$ at the network connection point and having an amplitude $\Delta\varphi_{AID}$ around a mean value $P_0$ which in turn corresponds to the constant phase difference $\Delta\varphi$. The coupling between the curve of the active power P at the network connection terminal or point and the curve of the phase $\varphi_{Br}$ at the bridge output is caused by the decoupling inductor of the inverter, said decoupling inductor being arranged between the bridge output and the network connection point. In one embodiment, a relationship $K=\Delta P_{AID}/\Delta\varphi_{AID}$ corresponds to a degree of correlation which can be used for detecting an island network. In the present case of a connection of the voltage source inverter to a superordinate network, this relationship is greater than a limit value that is to be predefined for detecting an island network, such that this connection to the superordinate network is detected. However, it is also conceivable in one embodiment to determine the degree of correlation using another relationship as a function of amplitude $\Delta\varphi_{AID}$ and amplitude $\Delta\varphi_{AID}$.

Figure 5:
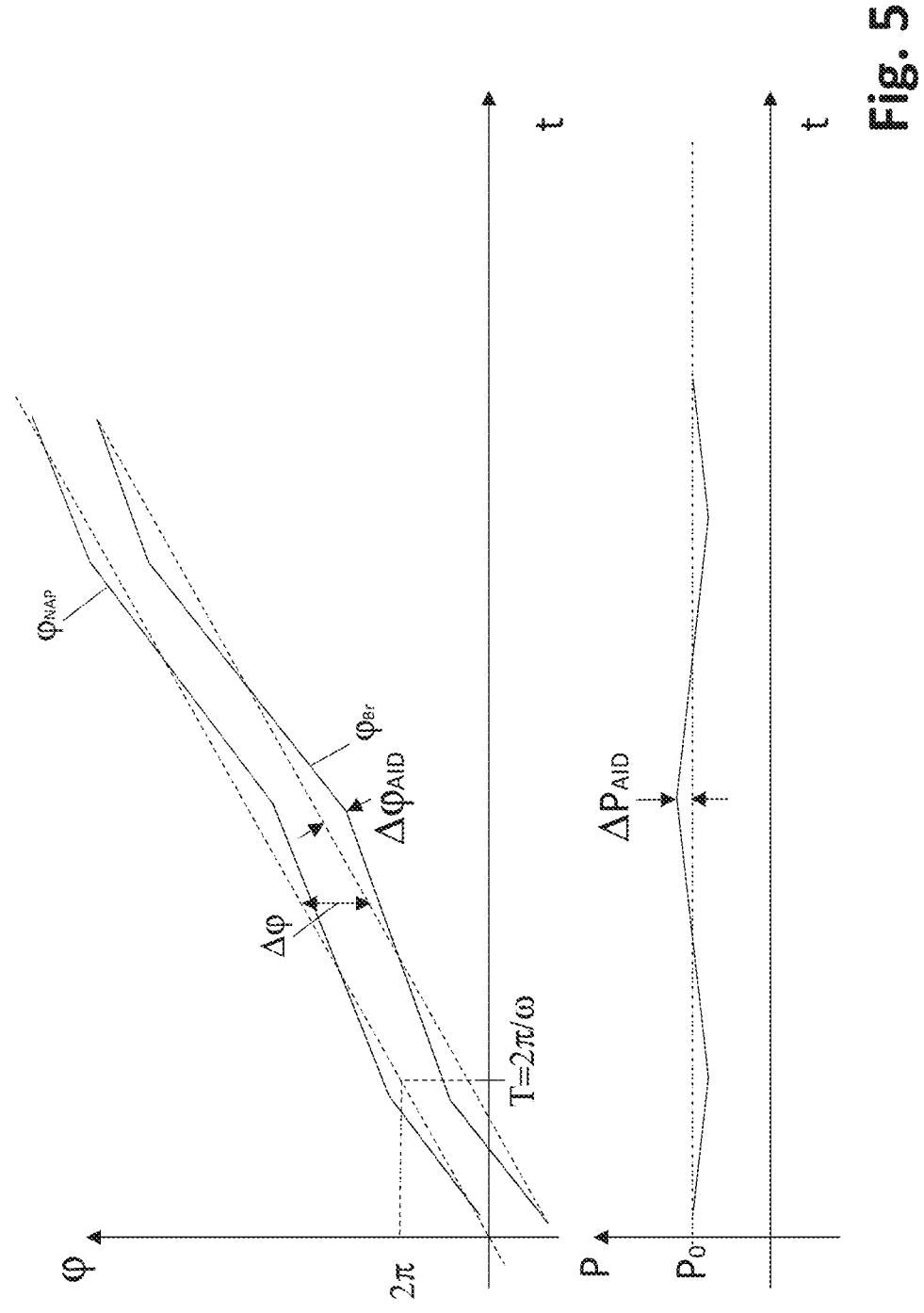
FIG. 5 shows time characteristics of phase and exchanged power when performing the method according to the disclosure in a first embodiment in the case of an island network and FIG. 6 shows time characteristics of phase and exchanged power when performing the method according to the disclosure in a second embodiment in the case of an island network.

FIG. 5 shows time characteristics of variables relevant for understanding the disclosure, when performing the method according to the disclosure in the case of a faulty or only very weak connection of the voltage source inverter, which is performing the method, to a superordinate network. The upper partial graph here shows in turn the time curve of the phase $\varphi_{NAP}$ at the network connection terminal or point and the time curve of the corresponding phase $\varphi_{Br}$ at the bridge output. The phase $\varphi_{Br}$ at the bridge output in turn periodically deviates from a linear curve (dashed line), here in the form of a sawtooth waveform having an amplitude $\Delta\varphi_{AID}$. In contrast to the case shown in FIG. 4 this deviation also causes a deviation in the phase $\varphi_{NAP}$ at the network connection point from a linear curve corresponding to the network frequency $\omega$; in illustrative terms, the phase $\varphi_{NAP}$ at the network connection point is not constant along the strongly linear curve but follows the phase $\varphi_{Br}$ at the bridge output to a certain extent.

This following may be complete, that is to say the amplitude of the deviation in the phase $\varphi_{NAP}$ at the network connection terminal or point from a purely linear curve would then correspond to the amplitude $\Delta\varphi_{AID}$ of the deviation in the phase $\varphi_{Br}$ at the bridge output from its linear profile, and the difference between the phase $\varphi_{Br}$ at the bridge output and the phase $\varphi_{NAP}$ at the network connection terminal or point would be constant over time. This may be the case, for example, if no further voltage source inverters are present in the island network that is completely disconnected from the superordinate network.

The following of the phase $\varphi_{NAP}$ at the network connection terminal or point can however also be only partial in one embodiment, that is to say the amplitude of the deviation in the phase $\varphi_{NAP}$ at the network connection terminal or point from a purely linear curve would then be less than the amplitude $\Delta\varphi_{AID}$ of the deviation in the phase $\varphi_{Br}$ at the bridge output from its linear profile, and the difference between the phase $\varphi_{Br}$ at the bridge output and the phase $\varphi_{NAP}$ at the network connection terminal or point would periodically vary with an amplitude which is less than the amplitude $\Delta P_{AID}$ of the deviation in the phase $\varphi_{Br}$. This case would occur, for example, if a weak connection to the superordinate network still exists or if further voltage source inverters are in operation in an island network. FIG. 5 is based on this case.

As a consequence of this situation, the curve of the active power P shown in the lower partial graph in FIG. 5 in turn has an amplitude $\Delta\varphi_{AID}$ around a mean value $P_0$, which amplitude is less than the amplitude of the active power P shown in FIG. 4 for the case of an existing low-impedance connection to a superordinate network. Accordingly, a degree of correlation determined, for example, by the relationship $K=\Delta\varphi_{AID}/\Delta\varphi_{AID}$ is also reduced in relation to the case of FIG. 4, and a limit value which, when not reached, is intended to indicate that an island network is detected can be readily defined in an appropriate manner.

Figure 6:
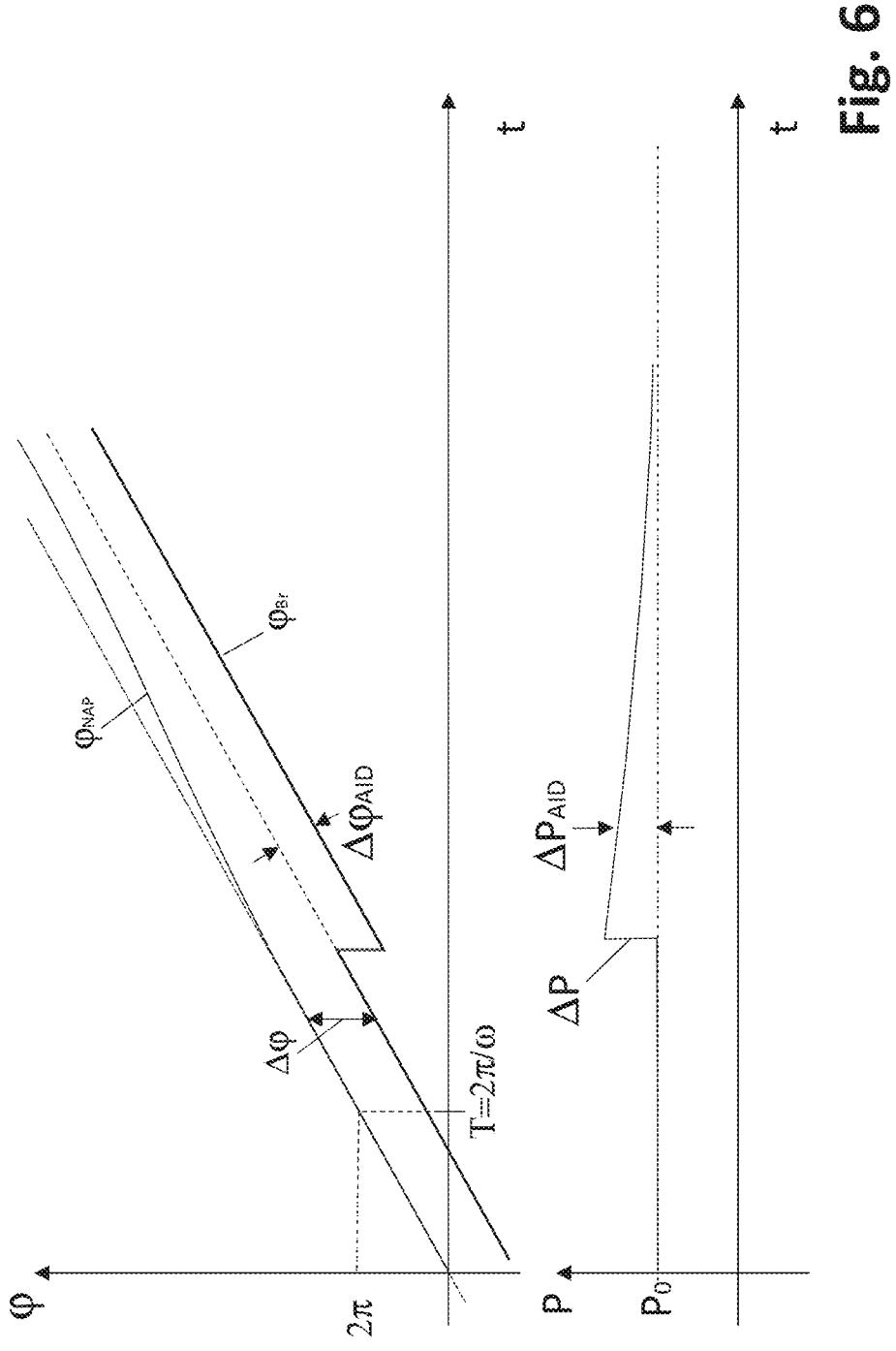

FIG. 6 shows example time characteristics of variables relevant for understanding the disclosure, when performing the method according to the disclosure in the case of a present island network, wherein a non-periodic variation in the phase $\varphi_{Br}$ at the bridge output, here a step function, is used. The phase $\varphi_{NAP}$ at the network connection terminal or point does not follow this step right away but only gradually once again approaches the phase difference $\Delta\varphi$ prevailing before the time of the step. Accordingly, the curve of the active power P has a jump $\Delta P$ corresponding to the height $\Delta\varphi_{AID}$ of the step, wherein the curve subsequently once again approaches the mean value $P_0$ of the active power before the jump. In this case, the degree of correlation by way of which the presence of an island network can be detected can be determined, for example, as the length of time over which the deviation $\Delta\varphi_{AID}$ from the mean value $P_0$ of the active power has fallen again below a predefined percentage of the jump height $\Delta P$. Other methods for determining the degree of correlation are of course also conceivable and contemplated by the present disclosure.

In the case of an existing low-impedance connection of the voltage source inverter to a superordinate network, the phase $\varphi_{NAP}$ at the network connection point would remain constant on the linear characteristic, with the result that the jump ΔP in the active power, caused by the step in the phase $\varphi_{Br}$ at the bridge output, is not reduced or is reduced only very slowly.

In order to detect an island network, the voltage source inverter can of course also make use of other periodic or non-periodic variations in the phase $\varphi_{Br}$ at the bridge output and methods adapted thereto for determining a degree of correlation or adapted limit values for distinguishing between an island network and a subnetwork connected with a sufficiently low impedance to a superordinate network, without leaving the scope of protection of the claims.

What is claimed is:

1. A method for detecting an island network using a voltage source inverter, comprising:

determining a frequency and a phase of a voltage curve of a subnetwork connected to a network connection terminal of the voltage source inverter, generating, by a bridge circuit of the voltage source inverter, another voltage curve having the determined frequency, wherein a phase of the generated another voltage curve comprises a first temporal variation with respect to the determined phase, determining a correlation between the first temporal variation and a second temporal variation in a power exchanged between the inverter and the subnetwork, and detecting an island network when the determined correlation does not reach a predefined degree of correlation.

2. The method according to claim 1, wherein the method is repeated at time intervals.

3. The method according to claim 1, further comprising disconnecting the voltage source inverter from the subnetwork when an island network is detected.

4. The method according to claim 3, further comprising, when an island network is detected, operating the voltage source inverter so that it drives an amplitude and/or a frequency of the subnetwork to be outside of one or more permissible network parameters in order to cause disconnection of further network components connected to the subnetwork before the inverter disconnects from the subnetwork.

5. The method according to claim 1, further comprising providing a detection signal at a signal output terminal of the voltage source inverter when an island network is detected.

6. The method according to claim 1, further comprising modulating, via the voltage source inverter, a detection signal, as a PLC signal, onto a voltage at the network connection terminal when the island network is detected.

7. The method according to claim 1, wherein the first temporal variation comprises a periodic variation having a first component at a first variation frequency.

8. The method according to claim 7, wherein an island network is detected when a ratio between a component of an active power of the power exchanged between the voltage source inverter and the subnetwork at the first variation frequency and the first component of the first temporal variation defines the determined correlation and does not reach a predefined limit value.

9. The method according to claim 7, wherein the first temporal variation comprises a second component having a second variation frequency higher than the first variation frequency, and wherein an island network is detected when a ratio between a component of the power exchanged between the inverter and the subnetwork at the first variation frequency and a component of the power exchanged between the voltage source inverter and the subnetwork at the second variation frequency does not reach a predefined limit value.

10. The method according to claim 1, wherein generating the voltage curve comprises increasing an amplitude of the first temporal variation, and further comprising terminating the method without detecting an island network when the temperol variation in a power exchanged between the voltage source inverter and the subnetwork exceeds a predefined value.

11. The method according to claim 10, further comprising, when the method is terminated without detecting an island network, using the amplitude of the first temporal variation to determine a starting amplitude of the first temporal variation when subsequently carrying out the island network detection method.

12. The method according to claim 1, wherein determining the frequency and the phase of the voltage curve of the subnetwork connected to the network connection point of the voltage source inverter comprises determining a third temporal variation in the phase, wherein the another voltage curve is generated having a temporal variation synchronous with the determined third temporal variation in the phase.

13. The method according to claim 1, wherein the subnetwork is a network having a first phase conductor and a second phase conductor, wherein the method is performed on the first phase conductor and the second phase conductor concurrently or one after the other, and wherein an island network is detected when a phase island network is detected on at least one of the first and second phase conductors.

14. The method according to claim 1, wherein the subnetwork is a network having a first phase conductor and a second phase conductor, wherein the method is performed on the first phase conductor and the second phase conductor concurrently or one after the other, wherein an island network is detected only when a phase island network is detected on both the first phase conductor and the second phase conductor.

15. The method according to claim 1, wherein an active power is used for determining the correlation between the first temporal variation and the second temporal variation in the power exchanged between the voltage source inverter and the subnetwork.

16. The method according to claim 1, wherein an apparent power or a weighted root mean square of an active power and a reactive power is used for determining the correlation between the first temporal variation and the second temporal variation in the power exchanged between the inverter and the subnetwork.

17. A voltage source inverter, comprising:

a measuring circuit configured to determine a frequency and a phase of a voltage curve of a subnetwork connected to a network connection terminal of the voltage source inverter, and further configured to determine values of active power and reactive power exchanged with the subnetwork, a control circuit configured to generate switching commands for a bridge circuit of the voltage source inverter such that another voltage curve predefined by the control circuit and having the determined frequency is generated at a bridge output of the bridge circuit, wherein the control circuit is configured to provide the predefined another voltage curve comprising a first temporal variation in the phase with respect to the phase of the determined voltage curve, and a correlator device configured to determine a degree of correlation between the first temporal variation in the phase and a second temporal variation in a power exchanged between the voltage source inverter and the subnetwork, wherein the correlator device is configured to detect an island network when the determined degree of correlation does not reach a predefined limit value.

* * * * *